(12) United States Patent
Zhang et al.

(10) Patent No.: US 12,100,601 B2
(45) Date of Patent: Sep. 24, 2024

(54) ETCHING METHOD WITH METAL HARD MASK

(71) Applicant: BEIJING NAURA MICROELECTRONICS EQUIPMENT CO., LTD., Beijing (CN)

(72) Inventors: Yu Zhang, Beijing (CN); Aki Akiba, Beijing (CN); Zhaocheng Liu, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 0 days.

(21) Appl. No.: 18/257,751

(22) PCT Filed: Dec. 15, 2021

(86) PCT No.: PCT/CN2021/138270
§ 371 (c)(1),
(2) Date: Jun. 15, 2023

(87) PCT Pub. No.: WO2022/127813
PCT Pub. Date: Jun. 23, 2022

(65) Prior Publication Data
US 2024/0112923 A1    Apr. 4, 2024

(30) Foreign Application Priority Data

Dec. 17, 2020    (CN) .......................... 202011499448.4

(51) Int. Cl.
H01L 21/311    (2006.01)
B08B 5/00    (2006.01)
(Continued)

(52) U.S. Cl.
CPC .......... *H01L 21/31144* (2013.01); *B08B 5/00* (2013.01); *B08B 9/00* (2013.01);
(Continued)

(58) Field of Classification Search
None
See application file for complete search history.

(56) References Cited

U.S. PATENT DOCUMENTS

| 2002/0063110 A1 | 5/2002 | Cantell et al. |
| 2012/0223418 A1 | 9/2012 | Stowers et al. |

(Continued)

FOREIGN PATENT DOCUMENTS

| CN | 101204705 A | 6/2008 |
| CN | 104658964 A | 5/2015 |

(Continued)

OTHER PUBLICATIONS

The World Intellectual Property Organization (WIPO) International Search Report for PCT/CN2021/138270 Jan. 27, 2022 5 Pages (including translation).

*Primary Examiner* — Roberts P Culbert
(74) *Attorney, Agent, or Firm* — ANOVA LAW GROUP, PLLC

(57) ABSTRACT

Embodiments of the present disclosure provide an etching method with a metal hard mask. The method is performed on a wafer surface and includes sequentially forming a metal hard mask layer and at least one functional film layer on a wafer surface in a direction away from the wafer surface. The method includes performing a plurality of etching processes on the at least one functional layer and the metal hard mask layer sequentially in a direction close to the wafer surface. An etching gas adopted by at least one etching process includes a hydrogen element and a fluorine element. A ratio of a content of the hydrogen element in the etching
(Continued)

Perform a plurality of etching processes on the at least one functional film layer and the metal hard mask layer in a direction toward o the wafer surface, among all the etching processes for the plurality of functional film layers, an etching gas used in at least one etching process including a hydrogen element and a fluorine element, and the ratio of the content of the hydrogen element in the etching gas to the content of the fluorine element in the etching gas being smaller than the predetermine threshold to reduce the generation of the byproduct of hydrogen fluorine    S1 gas to a content of the fluorine element in the etching gas is smaller than a predetermined threshold to reduce generation of a byproduct of hydrogen fluorine.

10 Claims, 4 Drawing Sheets

(51) Int. Cl.
  *B08B 9/00* (2006.01)
  *H01J 37/32* (2006.01)
  *H01L 21/3105* (2006.01)

(52) U.S. Cl.
  CPC .. *H01J 37/32449* (2013.01); *H01L 21/31058* (2013.01); *H01L 21/31116* (2013.01); *H01J 2237/334* (2013.01)

(56) References Cited

U.S. PATENT DOCUMENTS

| | | |
|---|---|---|
| 2015/0064918 A1 | 3/2015 | Ranjan et al. |
| 2016/0351407 A1 | 12/2016 | Sawataishi et al. |
| 2017/0053808 A1* | 2/2017 | Kamp ................. H01L 21/3065 |
| 2019/0185999 A1 | 6/2019 | Shanbhag et al. |

FOREIGN PATENT DOCUMENTS

| | | |
|---|---|---|
| CN | 104934364 A | 9/2015 |
| CN | 111933581 A | 11/2020 |
| CN | 112687537 A | 4/2021 |
| JP | H10189555 A | 7/1998 |
| JP | 2001176842 A | 6/2001 |
| JP | 2006269879 A | 10/2006 |
| JP | 2007258426 A | 10/2007 |
| JP | 2011187516 A | 9/2011 |
| JP | 2017045849 A | 3/2017 |

* cited by examiner

Perform a plurality of etching processes on the at least one functional film layer and the metal hard mask layer in a direction toward o the wafer surface, among all the etching processes for the plurality of functional film layers, an etching gas used in at least one etching process including a hydrogen element and a fluorine element, and the ratio of the content of the hydrogen element in the etching gas to the content of the fluorine element in the etching gas being smaller than the predetermine threshold to reduce the generation of the byproduct of hydrogen fluorine ⎯S1

FIG. 1

ETCHING METHOD WITH METAL HARD MASK

CROSS-REFERENCE TO RELATED APPLICATIONS

This application is a national phase entry under 35 U.S.C. § 371 of International Application No. PCT/CN2021/138270, filed on Dec. 15, 2021, which claims priority to Chinese Application No. 202011499448.4 filed on Dec. 17, 2020, the entire contents of both of which are incorporated herein by reference.

TECHNICAL FIELD

The present disclosure generally relates to the semiconductor manufacturing field and, more particularly, to a metal hard mask etching method.

BACKGROUND

Particle control capability is an important indicator for measuring apparatus stability and process stability in an integrated circuit manufacturing process. With stringent requirements for particle control, an integrated circuit apparatus faces challenges.

The particles are primarily introduced through process formation and external introduction. The process formation refers to particles generated during a process reaction. The external introduction mainly refers to particles introduced during wafer loading. Often, the particles introduced during wafer loading have been effectively controlled. However, the particles formed during processing have always been a significant issue in improving the etching technology.

For example, in a process at 28 nm and below, an etching process of a metal hard mask has an extremely stringent requirement for the particles. However, in the existing etching method with the metal hard mask, byproducts such as hydrogen fluoride (HF) produced during long-term mass production in the etching apparatus lead to loss of a surface material (e.g., a $Y_2O_3$ coating) at an inner surface of the chamber, which may cause the chamber to be un-usable due to coating damage. In addition, the byproducts such as HF can react with the $Y_2O_3$ coating to form particles containing yttrium, which leads to issues related to particles and defects.

SUMMARY

The present disclosure aims to address at least one technical problem in the existing technology and provides an etching method with a metal hard mask. The method can reduce formation of hydrogen fluoride byproducts, thereby reducing particles generated due to loss of a material (e.g., a $Y_2O_3$ coating) of the inner surface of the chamber.

To realize the purpose of the present disclosure, an etching method with a metal hard mask is provided. A metal hard mask and at least one functional film layer are formed sequentially on a wafer surface in a direction away from the wafer surface.

The etching method with the metal hard mask method further includes: performing a plurality of etching processes sequentially on the at least one functional film layer and the metal hard mask in a direction toward the wafer surface;
wherein at least one etching process of the plurality of etching processes of the functional film layer includes an etching gas containing a hydrogen element and a fluorine element, and a ratio of a content of the hydrogen element in the etching gas to a content of the fluorine element in the etching gas is smaller than a predetermined threshold to reduce generation of a byproduct of hydrogen fluoride.

In some embodiments, the ratio is less than or equal to 1.

In some embodiments, the ratio is less than or equal to 0.5.

In some embodiments, the method further includes, in the etching process with the etching gas that includes the hydrogen element and the fluorine element, introducing a first auxiliary gas into a process chamber while introducing the etching gas into the process chamber, the first auxiliary gas being used to promote the etching gas to be ionized to reduce the generation of the byproduct of hydrogen fluorine.

In some embodiments, the first auxiliary gas includes at least one of argon, helium, or oxygen.

In some embodiments, the method further includes:
performing at least one cleaning process on the process chamber after completing the plurality of etching processes, wherein each cleaning process is used to remove at least one reaction byproduct generated in the process chamber during the etching process;
wherein the reaction byproduct includes a silicon-containing byproduct, a cleaning gas used in a cleaning process for removing the silicon-containing byproduct includes a fluorine-containing gas and an auxiliary gas, and the second auxiliary gas is used to reduce generation of fluorine particles in a plasma formed by ionizing the fluorine-containing gas.

In some embodiments, a ratio of a flow rate of the auxiliary gas to a flow rate of the fluorine-containing gas ranges from 0.3 to 2.

In some embodiments, the auxiliary gas includes at least one of argon, helium, or oxygen.

In some embodiments, two functional film layers are provided and include a dielectric material layer and an organic material mask layer arranged sequentially on the metal hard mask in a direction away from the wafer surface.

The method further includes performing three etching processes on the organic material mask layer, the dielectric material layer, and the metal hard mask layer sequentially in the direction toward the wafer surface.

Etching gases adopted by two etching processes performed on the organic material mask layer and the dielectric material layer including the hydrogen element and the fluorine element.

In some embodiments, the two etching processes performed on the organic material mask layer and the dielectric material layer include $CF_4$, $CHF_3$, and $CH_2F_2$, and a ratio of flow rates of $CF_4$, $CHF_3$, and $CH_2F_2$ is set to cause the ratio of the content of the hydrogen element to the content of the fluorine element in $CF_4$, $CHF_3$, and $CH_2F_2$ in the etching gas to be smaller than the predetermined threshold.

Embodiments of the present disclosure have the following beneficial effects.

In the etching method with the metal hard mask of embodiments of the present disclosure, the etching gas of at least one etching process includes the hydrogen element and the fluorine element in the plurality of etching processes performed on the functional film layer. The ratio of the content of the hydrogen element in the etching gas to the content of the fluorine element in the etching gas is smaller than the predetermined threshold. By causing the ratio of the content of the hydrogen element in the etching gas to the content of the fluorine element in the etching gas to be smaller than the predetermined threshold, the generation of the byproduct of hydrogen fluorine can be reduced. Thus, the particles generated due to the loss of the material (e.g., the $Y_2O_3$ coating) of the inner surface of the chamber are reduced, thereby effectively controlling the particle issue and the defect issue.

BRIEF DESCRIPTION OF THE DRAWINGS

FIG. 1 illustrates a schematic flowchart of an etching method with a metal hard mask according to an embodiment of the present disclosure.

DETAILED DESCRIPTION OF THE EMBODIMENTS

Figure 2:
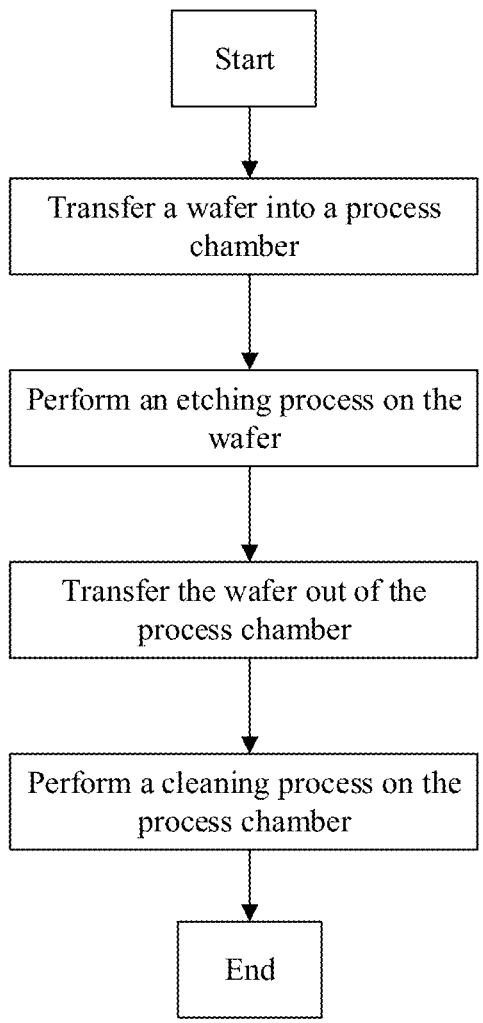
FIG. 2 illustrates a schematic process diagram of an etching method with a metal hard mask according to an embodiment of the present disclosure.

To cause those skilled in the art to better understand the technical solution of the present disclosure, an etching method with a metal hard mask of the embodiments of the present disclosure is described in detail in connection with the accompanying drawings.

Embodiments of the present disclosure provide the etching method with the metal hard mask. In this method, a metal hard mask layer and at least one functional film layer can be sequentially formed on a wafer surface in a direction away from the wafer surface (e.g., from bottom to top). In practical applications, numbers and types of functional film layers can vary with different technology nodes. For example, in the technology node at 28 nm, two functional film layers can be included, which can include a dielectric material layer and an organic material mask layer arranged sequentially on the metal hard mask layer in the direction away from the wafer surface. However, in the technology node at 14 nm, at least three functional film layers can be included. For example, in addition to the dielectric material layer and the organic material mask layer, an amorphous carbon layer or another organic material layer can be arranged between the dielectric material layer and the organic material mask layer. In addition, before etching the functional film layers, a patterned photoresist layer may need to be formed on the functional film layer at the very top. The patterned photoresist layer can be used to define patterns of the functional film layers and the metal hard mask layer when the functional film layers are etched.

In practical applications, the above wafer can include a conventional semiconductor substrate, for example, a silicon substrate, or a layered structure including a metal layer for interconnection and an interlayer dielectric layer. The metal hard mask layer can include a titanium nitride (TiN) layer. The dielectric material layer can include a silicon dioxide ($SiO_2$) layer and a silicon nitride (SiN) layer. The organic material mask layer can include a silicon anti-reflective coating (Si-arc layer) and a bottom anti-reflective coating (B-arc layer). Embodiments of the present disclosure do not impose any specific limitations on the types of the functional film layers.

FIG. 1 illustrates a schematic flowchart of an etching method with a metal hard mask according to an embodiment of the present disclosure. The method includes the following steps.

At S1, a plurality of etching processes are performed on the at least one functional film layer and the metal hard mask layer in a direction toward the wafer surface. Among all the etching processes for the plurality of functional film layers, an etching gas used in at least one etching process includes a hydrogen element and a fluorine element.

For example, the etching method with the metal hard mask can include three etching processes for etching the organic material mask layer, the dielectric material layer, and the metal hard mask layer in the direction toward the wafer surface. Etching gases used in two etching processes for etching the organic material mask layer and the dielectric material layer can include $CF_4$, $CHF_3$, and $CH_2F_2$. An etching gas used in the etching process for etching the metal hard mask layer can include $Cl_2$, $CH_4$, and $BCl_3$. In this case, both etching gases used in the etching processes for etching the organic material mask layer and the dielectric material layer can include the hydrogen element and the fluorine element. Of course, in practical applications, the types of the etching gases used in the etching processes for the functional film layers can be freely selected according to specific process requirements, which are not limited in embodiments of the present disclosure.

In the etching process, when the etching gas includes the hydrogen element and the fluorine element, a byproduct of hydrogen fluoride can be generated. The byproduct can react with the material of the inner surface of the chamber. For example, the material of the inner surface of the chamber includes the $Y_2O_3$ coating. The byproduct of hydrogen fluoride can react with the $Y_2O_3$ coating to form yttrium fluoride (YxFy). Since a molecular volume of the yttrium fluoride is smaller than a molecular volume of $Y_2O_3$, a shallow crack can appear in the $Y_2O_3$ coating. Thus, the particles containing a yttrium element can be easily formed. During long-term mass production using the etching apparatus, the formed byproduct of the hydrogen fluoride can cause loss of the $Y_2O_3$ coating, which causes the chamber to be unable to continue to be used. Meanwhile, the particles with the yttrium element can be formed, which causes the particle issue and the defect issue.

In addition, after all etching processes are completed, a cleaning process may need to be performed on the chamber to remove the reaction byproduct. Please refer to FIG. 2, the cleaning process includes first, transferring the wafer into a process chamber for etching, transferring the wafer out of the process chamber after completing the etching process, and then performing the cleaning process on the chamber.

In the cleaning process, a cleaning gas can typically include a nitrogen fluoride ($NF_3$) gas. The plasma generated from the gas can be highly corrosive and further penetrate the $Y_2O_3$ coating to produce yttrium fluoride (YxFy). In addition, if the cleaning gas includes $O_2$, $O_2$ can react with the $Y_2O_3$ coating to form YOF, which eventually flakes off and forms particles.

To address the above issues, for the etching processes with the etching gases including the hydrogen element and the fluorine element, the generation of the byproduct of hydrogen fluoride can be reduced by controlling a ratio of a content of the hydrogen element in the etching gas to a content of the fluoride element in the etching gas in a range smaller than a predetermined threshold. Thus, the particles (e.g., yttrium fluoride particles) generated by the reaction of the byproduct of hydrogen fluoride with the material of the inner surface of the chamber can be reduced. Meanwhile, the loss of the material (e.g., the $Y_2O_3$ coating) of the inner surface of the chamber can be reduced, thereby effectively controlling the particle issue and the defect issue.

It should be noted that the content of the hydrogen element and the content of the fluorine element in the etching gas can specifically refer to the contents of the hydrogen element and the fluorine element in the etching gas within the process chamber, respectively.

In some embodiments, the ratio of the content of the hydrogen element to the content of the fluorine element in the etching gas can be less than or equal to 1, for example, less than or equal to 0.5. By controlling the ratio within the specified range, the particles (e.g., yttrium fluoride particles) generated by the reaction of the byproducts of hydrogen fluoride and the material of the inner surface of the chamber can be effectively reduced. Meanwhile, the loss of the material (e.g., the $Y_2O_3$ coating) of the inner surface of the chamber can be reduced.

In some embodiments, the above ratio can be adjusted by regulating flow rates of various gases included in the etching gas. For example, when the etching gases used in the two etching processes for the organic material mask layer and the dielectric material layer can include $CF_4$ and $CHF_3$. The flow rates of $CF_4$ and $CHF_3$ can be set to 20 sccm and 100 sccm, respectively. In this case, the ratio of the content of the hydrogen element to the content of the fluorine element in the etching gas can be 0.26, which is smaller than 1. The particles generated by the reaction of the byproduct of hydrogen fluoride and the material of the inner surface of the chamber can be effectively reduced. For another example, when the etching gases used in the two etching processes for the organic material mask layer and the dielectric material layer can include $O_2$ and $CH_2F_2$. The flow rates of $O_2$ and $CH_2F_2$ can be set to 80 sccm and 100 sccm, respectively. In this case, the ratio of the content of the hydrogen element to the content of the fluorine element in the etching gas can be 1. The particles generated by the reaction of the byproduct of hydrogen fluoride and the material of the inner surface of the chamber can also be effectively reduced.

In some embodiments, in the etching processes with the etching gases including the hydrogen element and the fluorine element, a first auxiliary gas can be introduced into the process chamber, while the above etching gases are introduced into the process chamber. The first auxiliary gas can be used to facilitate the ionization of the etching gas to further reduce the generation of the byproduct of hydrogen fluoride. For example, if the etching gas includes $CHF_3$, the first auxiliary gas can cause $CHF_3$ to be further ionized to form free radicals and ions such as $CF_2+$ and $CF_3+$, thereby reducing the generation of the byproduct of hydrogen fluoride. In some embodiments, the first auxiliary gas can include at least one of argon, helium, or oxygen. Oxygen not only can promote $CHF_3$ to be further ionized into free radicals and ions such as $CF_2+$ and $CF_3+$, but also react with hydrogen ions to generate HO, thereby further reducing the generation of the byproduct of hydrogen fluoride.

Figure 3:
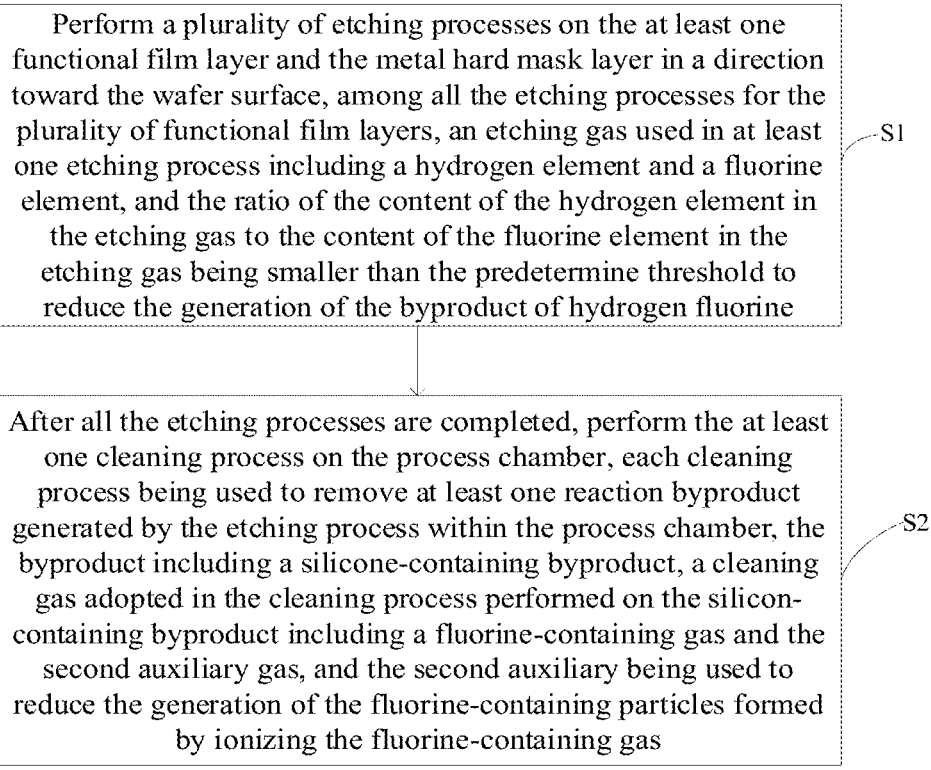
FIG. 3 illustrates a schematic flowchart of another etching method with a metal hard mask according to an embodiment of the present disclosure.

In some embodiments, as shown in FIG. 3, the above etching method with the metal hard mask further includes the following steps.

At S2, after all the etching processes are completed, the at least one cleaning process is performed on the process chamber. Each cleaning process is used to remove at least one reaction byproduct generated by the etching process within the process chamber.

In practical applications, the number of the cleaning processes and the type of cleaning gas used for each cleaning process can be selected based on the type of the reaction byproduct generated within the process chamber.

If the reaction byproduct includes a silicon-containing byproduct, the cleaning gas used for cleaning the silicon-containing byproduct can include a fluorine-containing gas and a second auxiliary gas. The fluorine-containing gas can include $NF_3$ and $SF_6$. The plasma generated from the fluorine-containing gas can have high corrosiveness and can further penetrate the $Y_2O_3$ coating to generate yttrium fluoride (YxFy). To address this issue, the second auxiliary gas can be used to reduce the generation of the fluorine-containing particles (e.g., free fluorine radicals) in the plasma by ionizing the fluorine-containing gas, thereby reducing the yttrium-containing particles formed by the reaction between the fluorine-containing particles and the $Y_2O_3$ coating.

In some embodiments, the composition of the plasma formed by ionizing the second auxiliary gas and the fluorine-containing gas can be controlled by controlling the ratio of the flow rate of the second auxiliary gas to the flow rate of the fluorine-containing gas. By achieving the cleaning purpose, the plasma formed by ionizing the second auxiliary gas can be ensured to effectively reduce the generation of the fluorine-containing particles (e.g., the free fluorine radicals) in the plasma formed by ionizing the fluorine-containing gas. In some embodiments, a range of the ratio between the flow rate of the second auxiliary gas and the flow rate of the fluorine-containing gas can be from 0.3 to 2. Within this range, the generation of the fluorine-containing particles (e.g., fluorine radicals) can be ensured to be effectively reduced in the plasma formed by ionizing the fluorine-containing gas.

In some embodiments, the above second auxiliary gas can include at least one of argon, helium, or oxygen.

For example, the etching method with the metal hard mask can include the three etching processes for sequentially etching the organic material mask layer, the dielectric material layer, and the metal hard mask layer in the direction toward the wafer surface and the corresponding cleaning processes. The etching method with the metal hard mask of embodiments of the present disclosure can be described in detail below.

Figure 4:
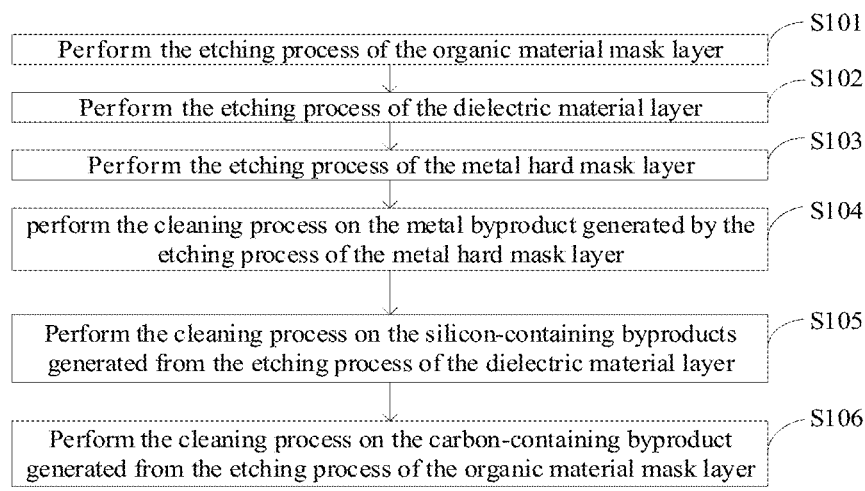
FIG. 4 illustrates a schematic flowchart of another etching method with a metal hard mask according to an embodiment of the present disclosure.

Referring to FIG. 4, the etching method with the metal hard mask includes the following steps.

At S101, the etching process of the organic material mask layer is performed.

The etching process of the organic material mask layer can adopt the following process parameters.

The etching gas can include gases containing the hydrogen element and fluorine element, for example, $CF_4$, $CHF_3$, and $CH_2F_2$, or a gas without the hydrogen element and fluorine element, for example, $Cl_2$ and $O_2$, or $Cl_2$, $O_2$, and $CH_4$. A process pressure can range from 3 mT to 40 mT, preferably, 5 mT to 20 mT. Excitation power can range from 200 W to 2000 W, preferably 400 W to 1200 W. Bias power can range from 20 W to 500 W, preferably 60 W to 200 W. If the etching gas includes $Cl_2$ and $O_2$, or $Cl_2$, $O_2$, and $CH_4$, the gas flow rate of $Cl_2$ can range from 50 sccm to 200 sccm, the gas flow rate of $O_2$ can range from 10 sccm to 35 sccm, and the gas flow rate of $CH_4$ can range from 0 sccm to 20 sccm. If the etching gas includes $CF_4$, $CHF_3$, and $CH_2F_2$, the gas flow rate of $CF_4$ can range from 0 sccm to 200 sccm, the gas flow rate of $CHF_3$ can range from 0 sccm to 200 sccm, and the gas flow rate of $CH_2F_2$ can range from 0 sccm to 200 sccm. Moreover, if the etching gas includes $CF_4$, $CHF_3$, and $CH_2F_2$, the first auxiliary gas can be introduced. For example, the first auxiliary gas can include at least one of Ar, He, or $O_2$. In this case, a gas flow rate of Ar can range from 0 sccm to 200 sccm, a gas flow rate of He can range from 0 sccm to 300 sccm, and a gas flow rate of $O_2$ can range from 0 sccm to 150 sccm.

After the etching process of the organic material mask layer is completed, a carbon-containing byproduct can be formed in the chamber.

At S102, the etching process of the dielectric material layer is performed.

The etching process of the dielectric material layer can adopt the following process parameters.

The etching gas can include a gas including the hydrogen element and the fluorine element, for example, $CF_4$, $CHF_3$, and $CH_2F_2$. In this case, the gas flow rate of $CF_4$ can range from 0 sccm to 200 sccm, the gas flow rate of $CHF_3$ can range from 0 sccm to 200 sccm, and the gas flow rate of $CH_2F_2$ can range from 0 sccm to 200 sccm. Moreover, a total flow rate of the etching gas adopted in the etching process of the dielectric material layer can be consistent with a total flow rate of the etching gas adopted in the etching process of the organic material mask layer. The process pressure can range from 3 mT to 80 mT, preferably 5 mT to 50 mT. The excitation power can range from 200 W to 2000 W, preferably 400 W to 1600 W. The bias power can range from 20 W to 500 W, preferably 60 W to 400 W.

After the etching process of the dielectric material layer is completed, the silicon-containing byproduct can be formed in the chamber.

At S103, the etching process of the metal hard mask layer is performed.

The etching process of the metal hard mask layer can adopt the following process parameters.

The etching gas can include $Cl_2$, $CH_4$, and $BCl_3$. In this case, a gas flow rate of $Cl_2$ can range from 0 sccm to 200 sccm, a gas flow rate of $CH_4$ can range from 0 sccm to 30 sccm, and a gas flow rate of $BCl_3$ can range from 0 sccm to 200 sccm. In some embodiments, according to specific process requirements, a morphology-trimming gas or an auxiliary gas for implementing other functions (e.g., a gas that promotes plasma dispersion) can be introduced while the etching gas is introduced. The morphology-trimming gas can include $NF_3$ and $SiCl_4$. The gas flow rate of $NF_3$ can range from 0 sccm to 200 sccm, and the gas flow rate of $SiCl_4$ can range from 0 sccm to 100 sccm. The auxiliary gases of other functions can include, for example, Ar, He, and $O_2$. A gas flow rate of Ar can range from 0 sccm to 200 sccm, a gas flow rate of He can range from 0 sccm to 300 sccm, and a gas flow rate of $O_2$ can range from 0 sccm to 150 sccm. The process pressure can range from 3 mT to 40 mT, preferably 5 mT to 20 mT. The excitation power can range from 200 W to 2000 W, preferably 400 W to 1200 W. The bias power can range from 20 W to 300 W, preferably 60 W to 200 W.

After the etching process of the metal hard mask layer is completed, the metal byproduct can be formed in the chamber.

In the etching processes of step 1 and step 3, if the etching gas includes the gases containing the hydrogen element and the fluorine element such as $CF_4$, $CHF_3$, and $CH_2F_2$, the ratio of the content of the hydrogen element to the content of the fluorine element can be controlled within the range smaller than the predetermined threshold. For example, the range of the ratio can range from 0 to 1, preferably 0 to 0.5.

Thus, the generation of the byproduct of hydrogen fluoride can be reduced. Thus, the particles (e.g., particles of yttrium fluoride) generated by the reaction between the byproduct of hydrogen fluoride and the material of the inner surface of the chamber can be reduced. Meanwhile, the loss of the material (e.g., the $Y_2O_3$ coating) of the inner surface of the chamber can be reduced, thereby effectively controlling the particle issue and the defect issue.

Further, in the two etching processes of step 1 and step 3, if the etching gas includes the gas including the hydrogen element and the fluorine element such as $CF_4$, $CHF_3$, and $CH_2F_2$, the first auxiliary gas can be introduced while the etching gas is introduced. The first auxiliary gas can be used to promote the ionization of the etching gas to further reduce the generation of the byproduct of hydrogen fluoride.

After the etching process is performed on the current wafer using the above etching method with the metal hard mask, for a plurality of byproducts formed in the process chamber, that is carbon-containing byproduct, silicon-containing byproduct, and metal byproduct, the following cleaning method can be performed on the process chamber for cleaning before the etching process is performed on a next wafer. The method includes:

at S104, performing the cleaning process on the metal byproduct generated by the etching process of the metal hard mask layer.

The specific process parameters can be as follows.

The cleaning gas is $Cl_2$, with a flow rate ranging from 0 sccm to 500 sccm.

The range of process pressure is 3 mT to 40 mT, preferably 5 mT to 20 mT.

The range of excitation power is 200 W to 2000 W, preferably 400 W to 1200 W.

S105, cleaning process is performed on the silicon-containing byproducts generated from the etching process of the dielectric material layer.

The specific process parameters are as follows:

The cleaning gas can include $NF_3$ and $SF_6$. The flow rate of $NF_3$ can range from 0 sccm to 300 sccm, and the flow rate of $SF_6$ can range from 0 sccm to 100 sccm. The cleaning gas can include a fluorine-containing gas. The plasma generated from the fluorine-containing gas can have high corrosiveness, which can further penetrate the $Y_2O_3$ coating to form yttrium fluoride (YxFy). To address this issue, a second auxiliary gas can be introduced while the fluorine-containing gas is introduced. The second auxiliary gas can be used to reduce the generation of fluorine-containing particles (e.g., fluorine radicals) in the plasma formed by ionizing the fluorine-containing gas. Thus, the yttrium-containing particles generated by the reaction between the fluorine-containing particles and the $Y_2O_3$ coating can be reduced. The second auxiliary gas can include at least one of Ar, He, or $O_2$. The gas flow rate of $O_2$ can range from 0 sccm to 500 sccm, the gas flow rate of Ar can range from 0 sccm to 500 sccm, and the gas flow rate of He can range from 0 sccm to 500 sccm. Furthermore, a ratio of the flow rate of the second auxiliary gas to the flow rate of the fluorine-containing gas can range from 0.3 to 2. Within this range, the generation of the fluorine-containing particles (e.g., fluorine radicals) in the plasma by ionizing the fluorine-containing gas can be effectively reduced. The process pressure can range from 5 mT to 250 mT, preferably 20 mT to 90 mT. The excitation power can range from 200 W to 2000 W, preferably 800 W to 1800 W.

At S106, the cleaning process is performed on the carbon-containing byproduct generated from the etching process of the organic material mask layer.

The specific process parameters can be as follows.

The cleaning gas can be $O_2$. A flow rate of $O_2$ can range from 0 sccm to 500 sccm. The process pressure can range from 3 mT to 40 mT, preferably 5 mT to 20 mT. The excitation power can range from 200 W to 2000 W, preferably 400 W to 1200 W.

The present disclosure is not limited to performing the cleaning in a sequence from step S104 to step S106. Step S104 to step S106 can also be performed in another order to clean the various byproducts above, which is not limited in the present disclosure.

Figure 5:
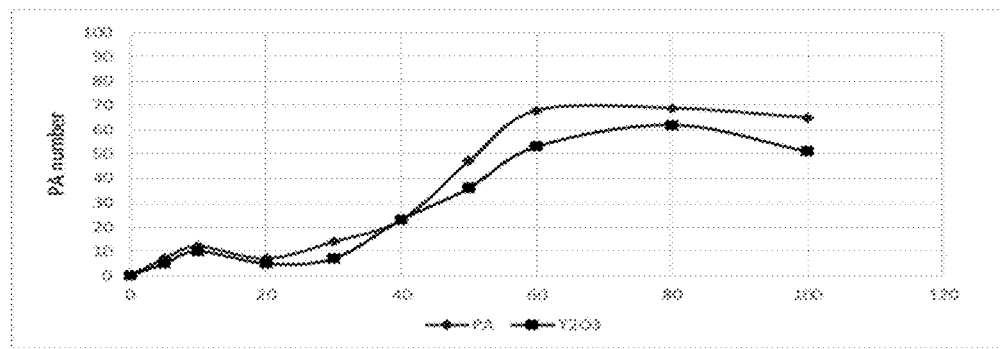
FIG. 5 illustrates a curve of chamber particles produced in an existing metal hard mask etching method and process time.
Figure 6:
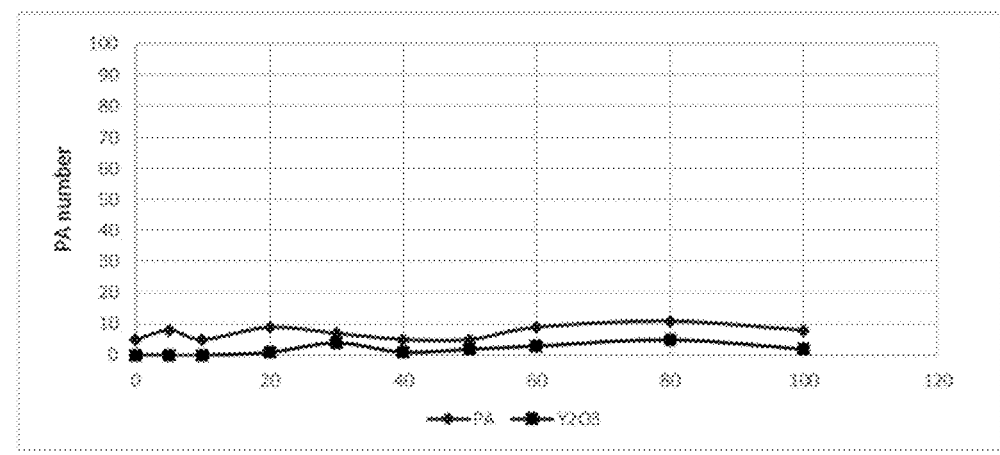
FIG. 6 illustrates a schematic diagram showing a curve of chamber particles produced in a metal hard mask etching method and process time according to embodiments of the present disclosure.

FIG. 5 illustrates a curve of chamber particles produced in an existing metal hard mask etching method and process time. FIG. 6 illustrates a schematic diagram showing a curve of chamber particles produced in a metal hard mask etching method and process time according to embodiments of the present disclosure. As shown in FIG. 5 and FIG. 6, PA denotes a total particle count in the process chamber, and $Y_2O_3$ denotes a particle count of $Y_2O_3$ in the process chamber. Comparing FIG. 5 and FIG. 6, in the existing etching method with the metal hard mask, the total particle count generated in the process chamber gradually increases to 70 as the process time cumulates, while the particle count of $Y_2O_3$ gradually increases to 60 as the process time cumulates. In contrast, in the etching method with the metal hard mask of embodiments of the present disclosure, the total particle count and the particle count of $Y_2O_3$ generated in the process chamber are both controlled below 10 at different process times (0-100 h). Thus, the particles generated due to the loss of the material (e.g., $Y_2O_3$ coating) of the inner surface of the chamber can be greatly reduced, thereby effectively controlling the particle issue and the defect issue.

In the etching method with the metal hard mask of embodiments of the present disclosure can be applied to fabrication of a logic chip product, such as a central processing unit (CPU), a graphics processing unit (GPU), a microprocessor (MPU), etc.

In summary, in the etching method with the metal hard mask of the embodiments of the present disclosure, the etching gas adopted by at least one etching process can include the hydrogen element and the fluorine element in all the etching processes for etching the functional film layers. The ratio of the content of the hydrogen element to the content of the fluorine element can be smaller than the predetermined threshold. By causing the ratio of the content of the hydrogen element in the etching gas to the content of the fluorine element in the etching gas to be smaller than the predetermined threshold, the byproduct of the hydrogen fluorine can be reduced. Thus, the particles generated due to the loss of the material (e.g., $Y_2O_3$ coating) of the inner surface of the chamber can be reduced, and the particle issue and the defect issue can be effectively controlled.

It should be understood that the above embodiments are merely illustrative embodiments for describing the principles of the present disclosure. However, the present disclosure is not limited to this. For those skilled in the art, without departing from the spirit and essence of the present disclosure, various variations and improvements can be made, and these variations and improvements can be within the scope of the present disclosure.

What is claimed is:

1. An etching method with a metal hard mask, which is performed on a wafer formed with a metal hard mask and at least one functional film layer sequentially on a surface in a direction away from the wafer surface, the method comprising:

performing a plurality of etching processes sequentially on the at least one functional film layer and the metal hard mask in a direction toward the wafer surface;

wherein:

at least one etching process of the plurality of etching processes of the functional film layer includes an etching gas containing a hydrogen element and a fluorine element; and a ratio of a content of the hydrogen element in the etching gas to a content of the fluorine element in the etching gas is smaller than a predetermined threshold to reduce generation of a byproduct of hydrogen fluoride.

2. The etching method with the metal hard mask according to claim 1, wherein the ratio is less than or equal to 1.

3. The etching method with the metal hard mask according to claim 2, wherein the ratio is less than or equal to 0.5.

4. The etching method with the metal hard mask according to claim 1, further comprising, in the etching process with the etching gas that includes the hydrogen element and the fluorine element:

introducing a first auxiliary gas into a process chamber while introducing the etching gas into the process chamber, the first auxiliary gas being used to promote the etching gas to be ionized to reduce the generation of the byproduct of hydrogen fluorine.

5. The etching method with the metal hard mask according to claim 4, wherein the first auxiliary gas includes at least one of argon, helium, or oxygen.

6. The etching method with the metal hard mask according to claim 1, further comprising:

performing at least one cleaning process on the process chamber after completing the plurality of etching processes, each cleaning process being used to remove at least one reaction byproduct generated in the process chamber during the etching process;

wherein:

the reaction byproduct includes a silicon-containing byproduct;

a cleaning gas used in a cleaning process for removing the silicon-containing byproduct includes a fluorine-containing gas and a second auxiliary gas; and the second auxiliary gas is used to reduce generation of fluorine particles in a plasma formed by ionizing the fluorine-containing gas.

7. The etching method with the metal hard mask according to claim 6, wherein a ratio of a flow rate of the second auxiliary gas to a flow rate of the fluorine-containing gas ranges from 0.3 to 2.

8. The etching method with the metal hard mask according to claim 6, wherein the second auxiliary gas includes at least one of argon, helium, or oxygen.

9. The etching method with the metal hard mask according to claim 1, wherein two functional film layers are provided and include a dielectric material layer and an organic material mask layer arranged sequentially on the metal hard mask in a direction away from the wafer surface;

the method further comprising:

performing three etching processes on the organic material mask layer, the dielectric material layer, and the metal hard mask layer sequentially in the direction close to the wafer surface, etching gases adopted by two etching processes performed on the organic material mask layer and the dielectric material layer including the hydrogen element and the fluorine element.

10. The etching method with the metal hard mask according to claim 9, wherein:
- the two etching processes performed on the organic material mask layer and the dielectric material layer include $CF_4$, $CHF_3$, and $CH_2F_2$; and
- a ratio of flow rates of $CF_4$, $CHF_3$, and $CH_2F_2$ is set to cause the ratio of the content of the hydrogen element to the content of the fluorine element in $CF_4$, $CHF_3$, and $CH_2F_2$ in the etching gas to be smaller than the predetermined threshold.

* * * * *